United States Patent
Patterson

(10) Patent No.: US 7,768,355 B2
(45) Date of Patent: Aug. 3, 2010

(54) POLYPHASE NUMERICALLY CONTROLLED OSCILLATOR

(75) Inventor: Jeffery S. Patterson, Cloverdale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 168 days.

(21) Appl. No.: 11/937,362

(22) Filed: Nov. 8, 2007

(65) Prior Publication Data
US 2009/0121796 A1    May 14, 2009

(51) Int. Cl.
*H03L 7/085* (2006.01)

(52) U.S. Cl. ............ 331/1 A; 331/177 R; 327/106; 327/114

(58) Field of Classification Search ............ 331/1 A, 331/177 R; 327/106, 114
See application file for complete search history.

(56) References Cited

U.S. PATENT DOCUMENTS

| | | | |
|---|---|---|---|
| 6,442,189 B1 * | 8/2002 | Song et al. ............ | 375/139 |
| 6,587,863 B1 * | 7/2003 | Gentile et al. .......... | 708/276 |
| 6,867,625 B1 * | 3/2005 | Stoyanov .............. | 327/105 |
| 7,103,622 B1 * | 9/2006 | Tucholski ............. | 708/276 |
| 7,109,808 B1 * | 9/2006 | Pelt ..................... | 331/45 |
| 7,336,721 B2 * | 2/2008 | Lee et al. .............. | 375/295 |
| 2005/0135524 A1 * | 6/2005 | Messier ................ | 375/354 |
| 2006/0227919 A1 * | 10/2006 | Wolaver ............... | 375/375 |

* cited by examiner

*Primary Examiner*—Joseph Chang
*Assistant Examiner*—Jeffrey Shin

(57) ABSTRACT

A polyphase numerically controlled oscillator is disclosed. An input signal is received at a phase accumulator. The phase accumulator provides a phase to a phase interpolator. The phase interpolator then provides a plurality of output phases. The plurality of output phases are provided to a plurality of phase to amplitude converters. Each of said plurality of phase to amplitude converters process one of said plurality of output phases.

18 Claims, 4 Drawing Sheets

US 7,768,355 B2

POLYPHASE NUMERICALLY CONTROLLED OSCILLATOR

TECHNICAL FIELD

The present disclosure is directed to generating digitally controlled waveforms. More specifically, the present disclosure is directed to systems and methods for generating digitally controlled waveforms with a polyphase numerically controlled oscillator.

BACKGROUND

Numerically controlled oscillators (NCOs) are used to generate digital waveforms at a specific frequency for a variety of uses such as in communications (e.g., cell phones or wireless internet). One example of a prior art numerically controlled oscillator, is illustrated in FIG. 1, as NCO 100. A NCO may also be referred to as a direct digital synthesizer (DDS). However, this is somewhat of a misnomer because, typically a DDS is the combination of an NCO and a digital-to-analog converter. NCO 100 includes phase accumulator 110 and phase to amplitude converter 120. NCO 100 receives input signal 101 and generates output signal 102, which is provided to digital-to-analog converter (DAC) 130.

The NCO of FIG. 1 relies on a different technique than that of an analog system to generate a wave at a desired frequency. Whereas a typical analog system may make use of an oscillator locked to a reference frequency, NCO 100 relies on the clock frequency of the associated digital device, such as DAC 130, to digitally create a sinusoidal waveform. The digital representation of the sinusoidal wave is output from NCO 100 as signal 102.

In generating the digital representation of the sinusoidal wave, input signal 101 is received at NCO 100. Signal 101 is a ratio of a desired frequency of the output divided by the clock frequency of the system. This ratio provides the phase step for each clock cycle of the system (e.g., a ratio of 0.1 is indicative of a one-tenth cycle change along the wave at each clock cycle of the system). Signal 101 passes through phase accumulator 110. Phase accumulator 110 is a component that determines the phase of a signal at a given instant of time. Phase accumulator 110 operates based on the theory that, for a constant frequency, the derivative of phase is a line whose slope is the normalized frequency. In this example, phase accumulator 110 adds $f_0$ cycles of phase to signal 101 once per clock period (where $f_0$ is the ratio of the desired frequency to the clock frequency of accumulator 110). Phase accumulator 110 performs this adding in order to determine which portion of the sinusoidal wave corresponds to signal 101 at each clock cycle.

Phase accumulator 110 includes summer 111 and delay block 112. At each clock cycle, summer 111 receives from delay block 112 the value of a previous output from accumulator 110 and adds that value to the current value. In the example where the desired frequency is constant, summer 111 adds a constant fractional value in relation to the clock frequency. For example, if the desired frequency for the sinusoidal wave is 1/10 of the clock rate, then summer 111 adds a constant 0.1 (where 0.1 is a decimal representation in cycles of the desired frequency) to the value from delay block 112 for each iteration.

The output of phase accumulator 110 is the phase angle, or $\theta_n$. By way of example, if NCO 100 starts at zero, the first output of accumulator 110 would be zero and the value of delay block 112 would also be zero. The next output cycle from accumulator 110 would be 0.1. This output value would also be provided to delay block 112, whose value would be incremented to 0.1. At this cycle there is no additive effect at summer 111 as the value of delay block 112 was originally zero. At the third cycle through accumulator 110, the value output from the accumulator is 0.2. (i.e. 0.1 frequency input plus the 0.1 value held in delay block 112) This output value of 0.2 is then stored in delay block 112, and added to the next output from accumulator 110 through summer 111. This additive effect acts to ramp up the value of accumulator 110.

Output $\theta_n$ of accumulator 110 is input to phase to amplitude converter 120 ("PAC"). PAC 120 takes the value of the phase received from phase accumulator 110 and converts that value to an amplitude on the corresponding sinusoidal wave. Typically, PAC 120 uses an index of values that associates a radian phase with an amplitude. This amplitude value is then output from PAC 120 as output signal 102.

Output signal 102 is provided to digital to analog converter 130. Digital to analog converter 130 converts the digital amplitude waveforms to analog signals forming a sinusoidal wave. One existing limitation to current NCOs is that the computation of phase to amplitude at PAC 120 is limited to the clock rate of the device upon which NCO 100 is disposed. Further, the output frequency cannot be more than one half the clock rate due to the Nyquist limit. In other words the largest value that can be input as input signal 101 in this example is 0.5. Thus, if NCO 100 has a clock rate of 500 MHz, the highest output frequency is 250 MHz. This phenomenon results from the fact that if a system the input signal 101 exceeds 0.5 by some value $\epsilon$, phase accumulator 110 produces an output that is indistinguishable from that of a system whose input signal 101 is 1-$\epsilon$. These clock rate limitations have become an increasing problem as the speed of digital-to-analog converters (as well as other circuitry using the output from NCOs) has increased significantly. However, the speeds of numerically controlled oscillators, such as NCO 100 cannot typically keep up with the speeds of the digital to analog converters (and other devices) as the accumulation and look-ups cannot be performed fast enough. Further, given these limitations NCO 100 cannot typically be used in a field programmable gate array (FPGA). Specifically, current FPGAs have an absolute maximum clock rate far below that of state of the art DACs. Currently, NCOs disposed on an FPGA cannot take advantage of these higher speed DACs.

BRIEF SUMMARY

There is disclosed systems and methods for generating digitally controlled signals having clock rates greater than a host clock rate by using a polyphase oscillator. In one embodiment a polyphase numerically controlled oscillator (NCO) is arranged such that its clock rate exceeds the clock rate of the host circuitry. Various embodiments of the invention receive a signal indicative of the desired frequency as a ratio to the clock rate at the NCO, and send this signal to a phase accumulator. The phase accumulator identifies a phase angle for the signal and provides that phase angle to a phase interpolator. The phase interpolator takes the received phase angle and interpolates the phase angles that fall between the present phase angle and the next anticipated phase angle for the NCO's clock rate. Each of the interpolated phase angles is provided to a separate phase to amplitude converter. Each of the phase to amplitude converters determines and outputs an amplitude based on the received phase.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 2:
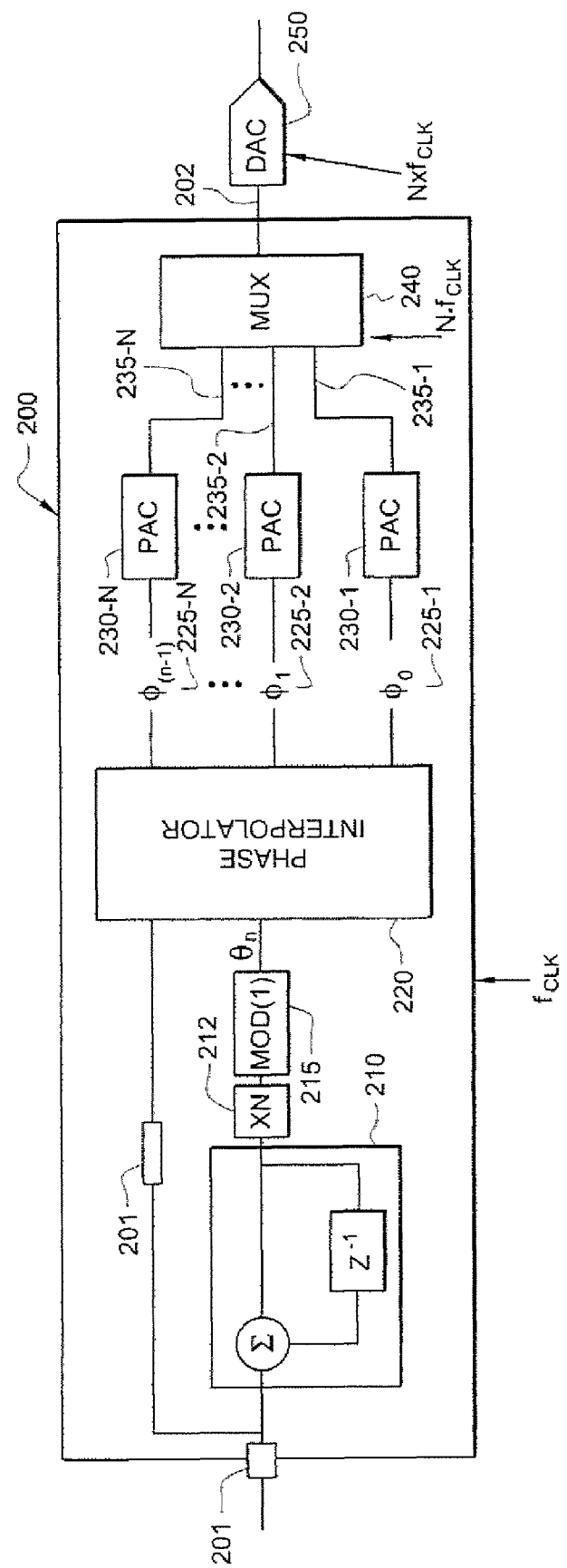
FIG. 2 is a block diagram illustrating an exemplary direct digital synthesizer according to one embodiment.

FIG. 2 is a block diagram illustrating exemplary polyphase NCO 200, according to one embodiment of the present invention. The term "polyphase NCO" indicates that a single input phase is used to generate a multiplicity of phases. In this embodiment, polyphase NCO 200 is illustrated as being a component of a DDS that also includes DAC 250. However, polyphase NCO 200 can be used in other system types, such as in a digital signal processor where the output of NCO 200 can be provided to a rotator. Polyphase NCO 200 includes phase accumulator 210, phase interpolator 220, and a plurality of phase to amplitude converters 230-1, 230-2 . . . 230-N. Polyphase NCO 200 receives input signal 201 and generates output signal 202 that is provided to DAC 250. Input signal 201 is the desired frequency divided by the clock rate of DAC 250. In this embodiment, DAC 250 has a clock rate 24 times faster than the clock rate of the polyphase NCO 200. However, the invention is not limited thereto, as other clock rate relationships may be employed by other embodiments. The operation of polyphase NCO 200 is such that it appears to an outside observer as if NCO 200 has a single phase accumulator and a single phase to amplitude converter that is running at the same speed as DAC 250, i.e. 24 times faster that its actual operating rate. Polyphase NCO 200 of FIG. 2 can be implemented in a variety of environments. For example, the polyphase NCO 200 can be disposed in or on a FPGA, a semiconductor device, a digital signal processor (DSP), etc.

Figure 1:
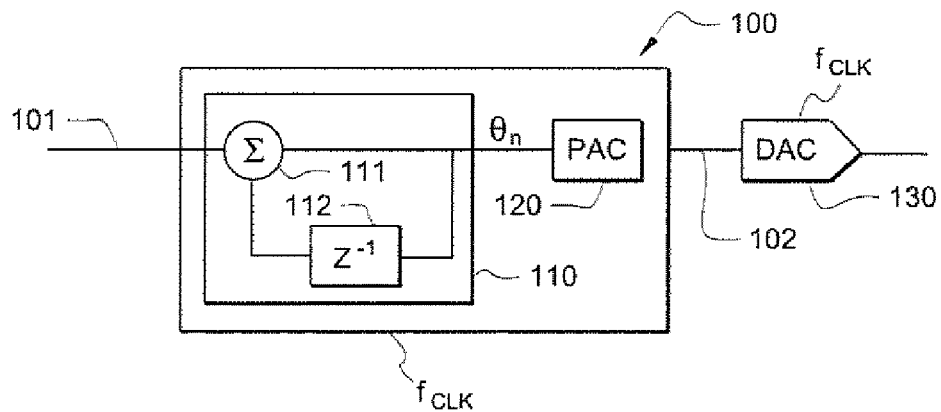
FIG. 1 is a block diagram illustrating a prior art direct digital synthesizer.

In this example, phase accumulator 210 operates in the same way that phase accumulator 110 of FIG. 1 operates, and therefore, will not be discussed in greater detail. Various embodiments use only a single phase accumulator, e.g. phase accumulator 210, to eliminate issues associated with synchronization and offsets that are present when multiple phase accumulators are used. However, other embodiments may employ a plurality of phase accumulators.

Prior to the output phase ($\theta_n$) of accumulator 210 reaching phase interpolator 220, the output phase is processed through multiplier 212 and modulo 215. Multiplier 212 takes the output from phase accumulator 210 and multiplies this value by the ratio of the frequency of the clock of DAC 250 to the clock rate of accumulator 210. Such multiplication brings the output angle to the correct position for the higher clock rate of DAC 250. Modulo 215 discards any overflows that may occur in multiplier 212. As these overflows represents a full cycle of phase they may be discarded, because the trigonometric functions which produce the output are indistinguishable at full cycle increments. To discard the overflow, modulo 215 removes from the output phase the integer portion, and leaves the only the fractional portion of the phase. This is possible because every integer output of multiplier 212 represents an integer number of full cycle phase shifts. Therefore, the removal of the integer portion does not change the output amplitude that is desired.

Phase interpolator 220 receives as an input the output phase of phase accumulator 210 as well as input signal 201 that was used by the phase accumulator 210 to determine the phase. From these two inputs phase interpolator 220 generates a number of intermediate phase angles ($\phi$) that are representative of the phase angles that fall between the current clocked phase angle and the next clocked phase angle. As the relationship between time and phase is a linear relationship with the slope being frequency, phase interpolator 220 uses this known relationship to determine the phase angle and associated time for intermediate points on the line. Phase interpolator 220 determines the number of phase angles 225-1, 225-2, . . . 225-N to achieve the desired output rate. Specifically, N is the number of times the desired clock rate exceeds the clock rate of polyphase NCO 200 (e.g. N=24 when the clock rate of the DAC is 24 times faster than the clock rate of polyphase NCO 200). Based on this number, a set of phase angles are interpolated from the linear relationship, assuming an equidistant separation of time. Each of the interpolated phase angles 225-1, 225-2, . . . 225-N is output from phase interpolator 220.

An example process used by phase interpolator 220 is provided below. In this example, phase interpolation is accomplished by sample interpolation in the phase domain whereby phase accumulator 210 produces samples at the lower core-clock (Cclk) rate (i.e. the clock rate of polyphase NCO 200). In this example, it is assumed that the clock rate of polyphase NCO 200 is 24 times slower than the desired clock rate. The samples produced by accumulator 210 are then unsampled by interpolator 220 whose functional description is given in Equation 1.

$$U_{24}[\theta(n), f, n] = \theta(n) + f \cdot \sum_{k=-11}^{+12} k \cdot \delta_{Clk}(m - 24 \cdot n - k) \quad (1)$$

In Equation 1 n is the Cclk sample number, m is the output sample number, f is the requested output frequency normalized to $F_{DAC}$ (clock frequency of the DAC) and $\theta(n)$ the low-rate phase input to phase interpolator 220. The summation in Equation 1 produces a sequence of 24 samples for each input sample θ(n). For example, the third input sample (n=2) produces output samples m=37 through 60, n=3 produces m=61 to 84 etc. The relationship between m and n can be expressed as $$n = \frac{m + 11 - \mod(m + 11, 24)}{24} \quad (2)$$

which is the integer division of m+11 by 24.

Likewise, the interpolation step k corresponding to the $m^{th}$ output sample is given by:

$$k = m - 24n = m - (m+11) - \mod(m+11,24) = -11 + \mod(m+11,24) \quad (3)$$

Based on Equations 1-3 the $m^{th}$ output sample is $$\theta_m = \theta\left[\frac{m + 11 - \mod(m + 11, 24)}{24}\right] - f \cdot (11 - \mod(m + 11, 24)) \quad (4)$$

Accumulator 210 advances by f every Cclk period $T_{Cclk}$. Assuming accumulator 210 started at zero, after n Cclk cycles, the total accumulated phase is:

$$\theta_A(n) = f \cdot n = f \frac{m + 11 - \mod(m + 11, 24)}{24} \quad (5)$$

Multiplying the contents of accumulator 210 contents by 24 before interpolating, the $m^{th}$ output sample will be from equation (4) with $\theta(n)=24 \cdot \theta_A(n)$, as follows:

$$\theta_m = 24 \cdot \theta_A(n) - f \cdot (11 - \mod(m + 11, 24))$$
$$= f \cdot (m + 11 - \mod(m + 11, 24)) - f \cdot (11 - \mod(m + 11, 24))$$
$$= m \cdot f$$

Thus, for constant f, $U_{24}[24 \cdot \theta_A(n), f, n]$ behaves identically to a phase accumulator clocked 24 times faster, i.e. at the rate of DAC 250. With $\theta(n)=24 \cdot \theta_A(n)$, equation (4) becomes:

$$\theta_m = 24 \cdot \theta_A\left[\frac{m + 11 - \mod(m + 11, 24)}{24}\right] - f \cdot (11 - \mod(m + 11, 24)) \quad (6)$$

Each output phase angle 225-1, 225-2, . . . 225-N is then provided to its own PAC 230-1, 230-2, . . . 230-N. Each of PACs 230-1, 230-2, . . . 230-N operate in the same manner as does PAC 120 of FIG. 1. However, the invention is not limited thereto, as a PAC may process more than one output phase angle in some embodiments. The calculations performed by each PAC 230-1, 230-2, . . . 230-N is performed simultaneously with the other PACs, and each PAC operates at the clock rate of polyphase NCO 200. The number of PAC's 230 (N) present in polyphase NCO 200 is based on the relationship between clock rate of polyphase NCO 200 and the clock rate of DAC 250. For example, if the clock rate of DAC 250 is ten times the clock rate of polyphase NCO 200, then ten PACs 230 are present, and phase interpolator 220 outputs ten phase angles.

Output amplitude signals 235-1, 235-2, . . . 235-N are provided to multiplexer 240. Multiplexer 240 takes output amplitudes 235-1, 235-2, . . . 235-N and provides them one at a time to digital to analog convener 250. In some embodiments multiplexer 240 outputs each of amplitude signals 235-1, 235-2, . . . 235-N in time order. Multiplexer 240 operates at the same clock speed as DAC 250. Thus, multiplexer 240 is able to pass each amplitude 235-1, 235-2, . . . 235-N to DAC 250 at the correct time for the sinusoidal wave desired. Thus, to DAC 250 it appears as if it is receiving amplitude signals 235-1, 235-2, . . . 235-N from a NCO that is operating at the same clock rate rather than the actual 1/N clock rate of the system clock. It should be noted that some embodiments omit multiplexer 240 altogether. For example, when the output of polyphase NCO 200 is to remain digital (e.g. in a digital signal processor), no multiplexer may be required and, therefore, will not necessarily be present in the embodiment. In some embodiments, the multiplexer may be built into the DAC and the full plurality of outputs from PACs 230 are passed in digital form to DAC 250.

Figure 3:
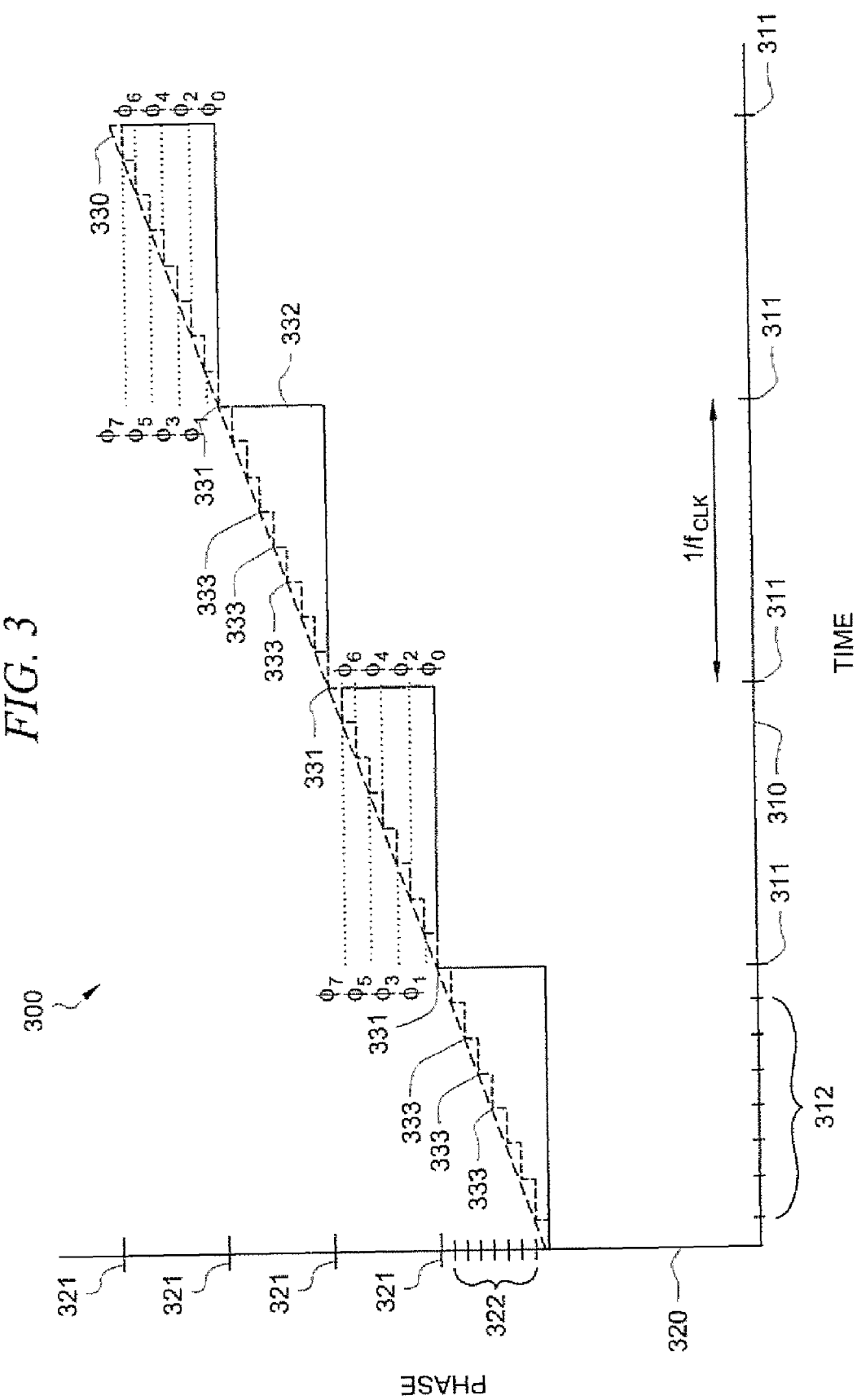
FIG. 3 is a graph illustrating a relationship between time and phase according to one embodiment.

FIG. 3 is a graphical plot 300 illustrating the operating relationship between phase angle and time used by phase accumulator 220 according to one embodiment. In the embodiment illustrated in FIG. 3 the clock rate of DAC 250 is eight times the clock rate of polyphase NCO 200. Graph 300 has an X-axis 310 and a Y-axis 320. X-axis 310 represents time, and Y-axis 320 represents the phase angle θ or φ.

X-axis 310 is divided into major divisions 311 and minor divisions 312. Major divisions 311 represents the time between one clock cycle of NCO 200. Minor divisions 312 represent the time between one clock cycle of DAC 250 (or other device operating at a clock rate that is faster than the clock rate of polyphase NCO 200). In the embodiment illustrated in FIG. 3 there are eight minor divisions 312 for every major division 311. Major divisions 311 and 312, respectively, illustrate the relationship between the $F_{clk}$ of the NCO to the $N^*F_{clk}$ of the DAC.

Y-axis 320 is divided into major divisions 321 and minor divisions 322. Major divisions 321 represent the phase angle output ($\phi_0$) from the phase accumulator without the modulo calculations. Minor divisions 322 represent the phase angles ($\phi_1$-$\phi_2$) that fall between the phase angles of the major divisions. In particular the number of minor divisions 322 is equal to the number of times the clock rate of the DAC exceed the clock rate of the NCO. Again in this embodiment, there are eight minor divisions 322 for every major division 321.

The phase angle ($\theta_n$) output from the phase accumulator is plotted versus time as points 331. Step line 332 illustrates the step relationship between each successive phase output of the phase accumulator. The relationship between points 331 of step line 332 is linear and can be expressed as a line, such as line 330. The slope of line 330 is the desired frequency divided by the clock rate of the outputing device (e.g., DAC 250). Based on this linear relationship of points 331, the intermediate phases (φ) can be interpolated. The intermediate phase for any time corresponds to the point on line 330 for that time. Points 333 correspond to the phase at each minor division 312 of time. It is this linear relationship that allows phase interpolator 220 of the embodiment of FIG. 2 to determine the intermediate phase angles (φ) that fall between the outputs from accumulator 210.

Figure 4:
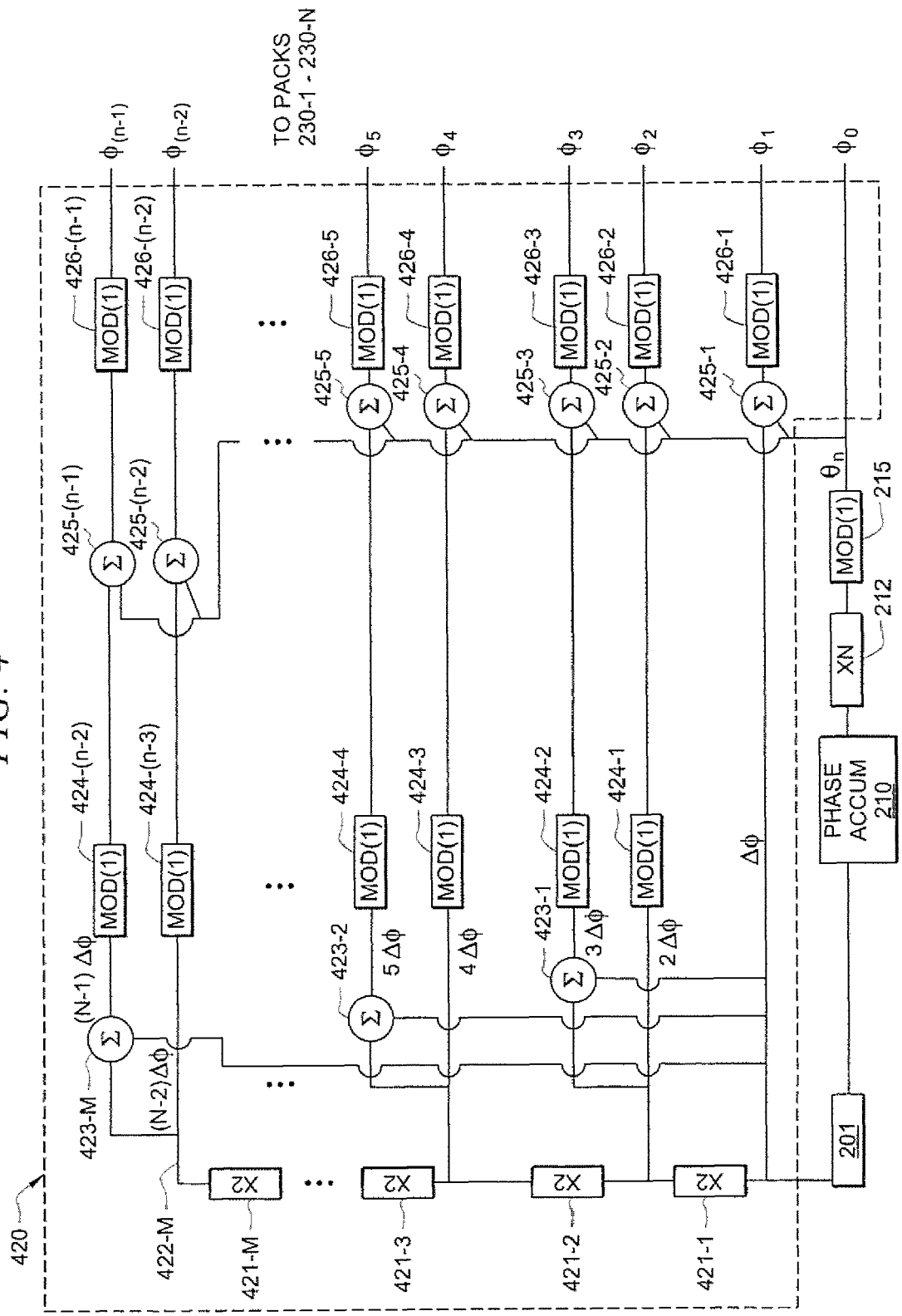
FIG. 4 is a block diagram illustrating the phase interpolator in greater detail according to one embodiment.

FIG. 4 is a detailed illustration of an exemplary phase interpolator 220 for use in a polyphase NCO, such as polyphase NCO 200, according to an embodiment. Similar to FIG. 2, input signal 201 is received. Signal 201 is representative of the desired phase step (or Δφ) between each clock cycle of the outputting device (e.g. DAC 250).

Signal 201 is passed to phase accumulator 210 and processed as discussed above in FIG. 2 to obtain an associated phase angle, $\theta_n$. Signal 201 is also passed to phase interpolator 420. It is in phase interpolator 420 that the intermediate phases (i.e. phases between phases output from phase accumulator 210) are interpolated prior to passing the interpolated phases to the phase to amplitude converters (230 of FIG. 2). As discussed above, signal 201 is representative of the difference ($\Delta\phi$) between each desired phase from the phase interpolator. Phase step ($\Delta\phi$) corresponds to the spacing between minor divisions 322 in FIG. 3. All of the phase steps falling between the calculated phases from accumulator 210 are determined within the clock rate of the accumulator. To increase the efficiency of this calculation phase interpollator 420 includes a number of multipliers 421-1, 421-2, 421-3 . . . 421-M (where M is N/2). However, other ratios can be used). Multipliers 421-1, 421-2, 421-3 . . . 421-M provide an efficient way to rapidly increase the value of the phase step ($\Delta\phi$) represented in signal 201 for the interpolation process.

Signal 201 enters phase interpolator 420 and is manipulated through a number of processes and components that form phase interpolator 420 as explained below. An unmodified version of signal 201 is provided to summer 425-1. Signal 201 is also provided to multiplier 421-1. At multiplier 421-1 the phase step ($\Delta\phi$) is multiplied by two. Output 422-1 of multiplier 421-1 is two times the phase step (i.e. $2\Delta\phi$). Output 422-1 is provided to three components of phase interpolator 420: multiplier 421-2, summer 423-1 and summer 425-2. Output 422-1 is provided to multiplier 421-2, and again is multiplied by two to generate output 422-2. Output 422-2 is four times the initial phase step (i.e. $4\Delta\phi$). Output 422-2 of multiplier 421-2 is provided to multiplier 421-3, sunder 423-2 and summer 425-4. The process of multiplying the output from a previous multiplier continues until all of the multipliers have been accessed.

As mentioned above Output 422-1 is provided to summer 423-1. Likewise, outputs 422-2, 422-3, . . . 422-M are provided to summers 423-2, 423-3, . . . 423-M respectively. Summer 423-1 also receives as an input the initial phase step (i.e. $\Delta\phi$). Summer 423-1 adds the value of output 422-1 (i.e. $2\Delta\phi$) to the initial phase step to obtain a phase step that is one phase step greater than output 422-1 (i.e. $3\Delta\phi$). This process calculates the phase steps that fall between the phase steps calculated by the multipliers 421-1, 421-2, 421-3 . . . 421-M. Once all of the phase steps are calculated the associated phase angle for each of these phase steps is calculated in the same way.

Output 422-1 is processed by phase interpolator 420 to obtain the appropriate phase angles for each phase step desired. Likewise, outputs 422-2, 422-3 . . . 422-M and the outputs from summers 423-1, 423-2, . . . 423-M are processed by phase interpolator 420 to obtain the phase step. Output phase step, such as the phase step of $2\Delta\phi$ associated with output 422-1, is first processed through modulo 424-1. Likewise other phase steps greater than $2\Delta\phi$ are processed by modulos 424-2, 424-3, 424-3, . . . 424-(N-2) respectively. However, the phase step of $\Delta\phi$ is not passed through a modulo as it is, by definition, less than 1. At modulo 424-1 the value of the phase step that exceeds 1 is reduced such that the value falls under 1 by discarding any overflow that occurs. This value is then provided to a summer, such as summer 425-2. At summer 425-2 the value of the phase step ($2\Delta\phi$) is added to the output phase $\theta_n$ determined by phase accumulator 210 to obtain an output phase angle 427-2 associated with that phase step ($2\Delta\phi$). Thus, output 427-2 is passed through modulo 426-2 again to reduce the phase angle if the phase angle exceeds 1. The output of modulo 426-2 is passed to the phase to amplitude converters discussed in FIG. 2 (in this example the output of modulo 426-2 is illustrated as $\phi_2$). Likewise, the same process is performed for each of the remaining phases to be interpolated by interpolator 420 and provided to the phase to amplitude converters 230. However, it should be noted that the output from accumulator 210 is output unchanged from interpolator 420 as this output is the actual phase angle for $\phi_0$ and does not require interpolation. In one embodiment, such as the embodiment described in equations 1-6, above, the calculated phase steps are both added and subtracted from the mid-tread value output from phase accumulator 210. By re-using the phase steps in this manner, the required number of phase step calculations is reduced by a factor of two. However, this results in added complexity as the extremes of the interpolator output should be aligned with the output from the previous step.

Figure 5:
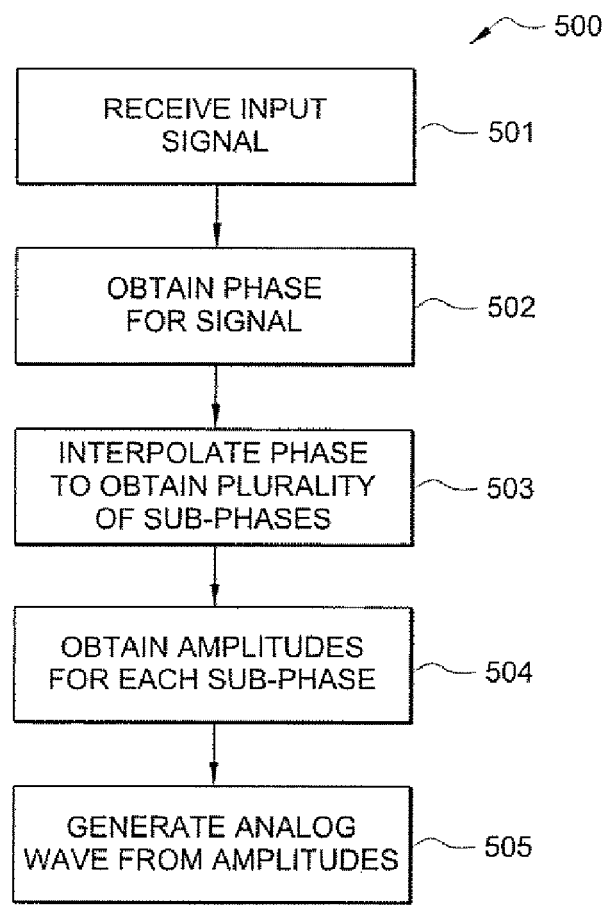
FIG. 5 is a flow diagram illustrating a process for interpolating a plurality of sub-phases from a calculated phase according to one embodiment.

FIG. 5 is a flow diagram illustrating a process 500 according to one illustrative embodiment. Process 500 can be performed on an NCO, such as NCO 200 of FIG. 2. At process 501 an input signal, such as signal 201 (FIG. 2), is received at NCO. This input signal is expressed as the desired output frequency divided by the clock rate of a DAC (or other component) having a clock rate that is faster than the system clock of the NCO, and is representative of the phase step between each clock cycle. The input signal is processed through phase accumulator 210 of the NCO (which has a clock rate less than the clock rate of the DAC) to obtain an associated phase angle at process 502. The output phase angle is then multiplied by the ratio of the clock rate of the DAC (or other component) to the clock rate of the accumulator. Additionally, a modulo operation may be performed if the phase angle exceeds 1.

The input signal is also provided to a phase interpolator, such as phase interpolator 220 or phase interpolator 420 (of FIGS. 2 and 4, respectively). The phase interpolator also receives the phase angle calculated at process 502. From the phase angle and the input signal the phase interpolator interpolates a number of sub-phase angles at process 503. The number of sub-phase angles is in one embodiment the factor by which the clock rate of the DAC exceeds the clock rate of the accumulator.

Once the plurality of sub-phase angles have been interpolated at process 503 the plurality of sub-phase angles are provided to a plurality of phase to amplitude converters, such as phase to amplitude converters 230-1, 230-2, . . . 230-N (FIG. 2). The phase to amplitude converters converts each of the plurality of sub-phase angles to an associated amplitude at process 504. The phase to amplitude converters, in one embodiment, use a look-up table that associates a given phase with a specific amplitude on a sinusoidal wave. Other embodiments may obtain the desired outputs from a calculation based on the input plurality of phases. In some embodiments, the digital representation of the sinusoidal wave is converted to an analog wave at process 505. This is typically achieved through the use of a digital to analog converter, such as DAC 250 (FIG. 2). In other embodiments the digital representation of the sinusoid is provided directly to other components for use at process 505.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A numerically controlled oscillator comprising:
a phase accumulator receiving an input signal;
a phase interpolator connected to said phase accumulator providing a plurality of output phases; and
a plurality of phase to amplitude converters connected to said phase interpolator, each of said plurality of phase to amplitude converters processing one of said plurality of output phases, wherein said phase interpolator performs a modulo operation to discard numerical overflows or underflows.

2. The numerically controlled oscillator of claim 1 further comprising:
a multiplexer connected to said plurality of phase to amplitude converters selectively outputting amplitudes from said plurality of phase to amplitude converters.

3. The numerically controlled oscillator of claim 1 further comprising:
a multiplier disposed between said phase accumulators and said phase interpolator, and
a modulo operation on an output of said multiplier, said modulo removing an integer component of an output from said multiplier.

4. The numerically controlled oscillator of claim 1 wherein said phase interpolator is configured to receive an output phase from said phase accumulator said input signal, and wherein said plurality of output phases are interpolated based an said output phase and said input signal.

5. The numerically controlled oscillator of claim 2 wherein said multiplexer orders each of said plurality of output amplitudes in a time order.

6. The numerically controlled oscillator of claim 2 further comprising:
a digital to analog converter coupled to said multiplexer.

7. The numerically controlled oscillator of claim 1 wherein said polyphase numerically controlled oscillator is disposed on a field programmable gate array.

8. The numerically controlled oscillator of claim 1 wherein a number of said plurality of phase to amplitude converters corresponds to a relationship between said clock rate of said digital to analog converter and said clock rate of said phase accumulator.

9. A method comprising:
receiving a signal at a numerically controlled oscillator;
processing said signal through a phase accumulator to obtain a phase angle;
interpolating said phase angle with a phase interpolator to obtain a plurality of sub-phase angles; and
obtaining a plurality of amplitudes, wherein each of said amplitudes corresponds to one of said plurality of sub-phase angles,
wherein said interpolating includes performing a modulo operation to discard numerical overflows or underflows.

10. The method of claim 9 further comprising:
converting said plurality of amplitudes to an analog wave form.

11. The method of claim 9 further comprising:
providing said plurality of amplitudes to a multiplexer.

12. The method of claim 9 further comprising:
removing an overflow component from said associated phase angle prior to interpolating said phase angle.

13. The method of claim 9 wherein obtaining said plurality of amplitudes further comprises:
processing each of said plurality of sub-phase angles through one of a plurality of phase to amplitude converters.

14. The method of claim 10 wherein said converting is performed on a digital to analog converter having a clock speed that is an integer multiple greater than a clock speed associated with said phase accumulator.

15. The method of claim 14 wherein a number of said plurality of sub-phases is equal to a ratio of said clock speed of said digital to analog converter to the clock speed of said phase accumulator.

16. A numerically controlled oscillator, comprising:
means for interpolating a single phase angle to obtain multiple phase angles, and
means for converting each said multiple phase angles to an amplitude,
said means for interpolating further including means for discarding a portion of a numerical overflow.

17. The numerically controlled oscillator of claim 16 wherein said means for converting, comprises:
a plurality of means for converting, each means for converting associated with one of said multiple phase angles.

18. The numerically controlled oscillator of claim 16 wherein said digital to analog converter has a clock rate that exceeds the clock rate of said direct digital synthesizer.

* * * * *